United States Patent
Mittal

(10) Patent No.: US 7,457,992 B2
(45) Date of Patent: Nov. 25, 2008

(54) DELAY FAULT TEST CIRCUITRY AND RELATED METHOD

(75) Inventor: Aviral Mittal, Eastleigh (GB)

(73) Assignee: NXP B.V., Eindhoven (NL)

( * ) Notice: Subject to any disclaimer, the term of this patent is extended or adjusted under 35 U.S.C. 154(b) by 273 days.

(21) Appl. No.: 10/584,705

(22) PCT Filed: Dec. 17, 2004

(86) PCT No.: PCT/IB2004/052847

§ 371 (c)(1),
(2), (4) Date: Jun. 23, 2006

(87) PCT Pub. No.: WO2005/066645

PCT Pub. Date: Jul. 21, 2005

(65) Prior Publication Data

US 2007/0168158 A1    Jul. 19, 2007

(30) Foreign Application Priority Data

Dec. 27, 2003  (GB) ................................. 0330076.1

(51) Int. Cl.
*G11B 20/20*  (2006.01)
*G01R 31/28*  (2006.01)
(52) U.S. Cl. ..................................... 714/700; 714/724
(58) Field of Classification Search ................. 714/724, 714/726, 731, 700
See application file for complete search history.

(56) References Cited

U.S. PATENT DOCUMENTS

| | | | |
|---|---|---|---|
| 6,081,913 A * | 6/2000 | Narayanan et al. | 714/724 |
| 6,484,294 B1 * | 11/2002 | Kiyoshige et al. | 716/4 |
| 6,510,534 B1 * | 1/2003 | Nadeau-Dostie et al. | 714/724 |
| 6,954,887 B2 * | 10/2005 | Wang et al. | 714/729 |
| 6,966,021 B2 * | 11/2005 | Rajski et al. | 714/726 |
| 7,058,866 B2 * | 6/2006 | Flanagan et al. | 714/726 |
| 7,131,041 B2 * | 10/2006 | Ozaki | 714/724 |
| 2003/0101396 A1 | 5/2003 | Price | |

* cited by examiner

*Primary Examiner*—James C Kerveros
(74) *Attorney, Agent, or Firm*—Peter Zawilski

(57) ABSTRACT

The invention provides for a delay fault test circuitry for producing a train of two clock pulses in response to two respective clock signals of different frequency associated with logic circuits to be tested and which are arranged to run at different speeds, and arranged such that the rising edges of the second of the clock pulses are aligned and further including counting means for producing a reference count value, means for initiating the first of the two clock pulses when the said count value reaches a first threshold value, means for ending the first of the two clock pulses when the said count value reaches a second threshold value, means for initiating the second of the two clock pulses when the said count value reaches a third threshold value; means for ending the second of the two clock pulses when the count value reaches a fourth threshold value, wherein the third threshold value is common for both input clock signals and the first, second and fourth threshold values are based on the respective frequencies of the clock signals.

16 Claims, 4 Drawing Sheets

DELAY FAULT TEST CIRCUITRY AND RELATED METHOD

The present invention relates to delay fault test circuitry, and a related method, for use in testing an integrated circuit for resistive and/or capacitive faults.

Such an arrangement is known from US Patent Application US 2003/0101396 A1 and which discloses delay fault test circuitry arranged to produce a two pulse train on incoming clock signals so as to allow for the testing of data transfers between logic blocks within the integrated circuit running at different application speeds.

The circuitry is arranged such that the rising, or positive, edges of the second pulses in each of the two-pulse trains then occuring at application frequency are aligned.

However, the manner in which the two pulses are generated within the above-mentioned reference disadvantageously exhibits limitations in performance. A relatively large time is taken to generate the two application frequency clock pulses once a request has been made that such pulses are required. This time delay is also generally dependent upon the frequencies of the clocks required in the circuit under test. The arrangement disclosed in this document relies upon the occurrence of an instance at which the inputs to a clock generator actually see an event in which the second edges of each of the input clock pulses are aligned and it is then necessary to wait again for such an event to occur in order to enable and pass such an event to the output.

If such an event doesn't re-occur, then the arrangement in any case fails. Also, as a further limitation, the subject matter of this US patent application cannot be used for clocks having time periods which are an odd multiple of the fastest clock time period arising in the circuit under test. This means that during fault test, those clocks which have time periods which are odd multiple of the fastest time period, must be re-generated with time periods equal to the nearest even multiple. For example if the fastest clock frequency is "f", and a time period T=1/f, and one of the clocks has a frequency=f/3, (and time period=3T) then during delay test, instead of f/3, a f/4 (time period=4T) frequency clock has to be generated, which means that it does not adhere to the required specifications. The delay fault test is then disadvantageously conducted at a slower clock, with time period 4T, instead of at the desired time period 3T.

Finally, this known design will not work for certain clock frequencies which have a 50% duty cycle which therefore require the duty cycle to be modified. This represents a further particularly disadvantageous limitation of this known arrangement.

The present invention seeks to provide for a delay fault test circuitry, and related method, having advantages over known such circuitry and methods.

According to one aspect of the present invention, there is provided a delay fault test circuitry for producing a train of two clock pulses in response to two respective clock signals of different frequency associated with logic circuits arranged to run at different speeds, and arranged such that the rising edges of the second of the clock pulses are aligned, the circuitry including:

counting means for producing a reference count value;

means for initiating the first of the two clock pulses when the said count value reaches a first threshold value;

means for ending the first of the two clock pulses when the said count value reaches a second threshold value;

means for initiating the second of the two clock pulses when the said count value reaches a third threshold value;

means for ending the second of the two clock pulses when the count value reaches a fourth threshold value; wherein the third threshold value is common for both input clock signals and the first, second and fourth threshold values are based on the respective frequencies of the clock signals.

Preferably, the said first, second and fourth threshold values comprise functions of the ratio of the fastest clock frequency to the clock frequency associated with the logic circuitry under test. Further the first, second and fourth threshold values are functions of the maximum of the aforesaid ratios.

In this case the first threshold value can be derived from the difference between the said maximum ratio value and the ratio value for the clock signal associated with the logic circuit under test Yet further, the second threshold value can be determined on the basis of the difference between the said maximum ratio value and half of the ratio value for the clock signal associated with the logic circuit under test, if the said ratio value comprises an even number.

In the alternative, the second threshold value can be determined on the basis of the difference between the maximum ratio value and half of the ratio value for the clock signal associated with the logic circuit under test, plus one, if the particular ratio comprises an odd number.

The fourth threshold count value is advantageously determined on the basis of the sum of the maximum ratio and half of the particular division ratio of the clock signal associated with the logic circuit under test.

A ratio generator is preferably included in which the aforementioned ratio is implemented by way of a counter.

Advantageously, the circuitry can employ two counters in order to calculate each of the aforesaid ratios.

In this manner the first of the two counters can be arranged to be fed by the fastclk signal and arranged to receive an enable signal generated by the other of the two said counters.

Further, the second counter is arranged to be fed by the clock signal with respect to which the division ratio is to be calculated.

The least significant bit of the said second counter preferably comprises the enable signal delivered to the said first counter, and wherein the most significant bit of the second counter preferably comprises a signal indicating that the required ratio has been determined.

The present invention is particularly advantageous in that the two application frequency clock pulses required can be generated almost instantaneously as and when required. In particular, the two application clock frequency pulses with their aligned second rising edges are produced in a manner independent of the actual frequencies of the clock signals concerned. The invention advantageously produces the two aligned clock-edges irrespective of the nature of the input to the clock signal and irrespective of whether there is an occurrence of a prior event at the input clocks have the rising edges of their second clock pulses aligned.

As a further advantage, the present invention can easily function with clocks have time periods which represent an odd multiple of the fastest clock time period within the circuitry under test and, yet further, the duty-cycle restrictions arising in the above-mentioned prior-art document do not arise in the present invention.

According to another aspect of the present invention, there is provided a method of producing a delay fault test signal comprising a train of two clock pulses in response to two respective clock signals of different frequency associated with logic circuits arranged to run at different speeds, and wherein the rising edges of the second of the clock pulses are aligned, the method including the steps of:

producing a reference count value;

initiating the first of the two clock pulses when the said count value reaches a first threshold value;

ending the first of the two clock pulses when the said count value reaches a second threshold value;

initiating the second of the two clock pulses when the said count value reaches a third threshold value;

ending the second of the two clock pulses when the count value reaches a fourth threshold value; wherein the third threshold value is common for both input clock signals and the first, second and fourth threshold values are based on the respective frequencies of the clock signals.

The method can advantageously include further aspects so as to provide for further features such as those discussed above.

The invention is described further hereinafter, by way of example only, with reference to the accompanying drawings in which.

Figure 1A:
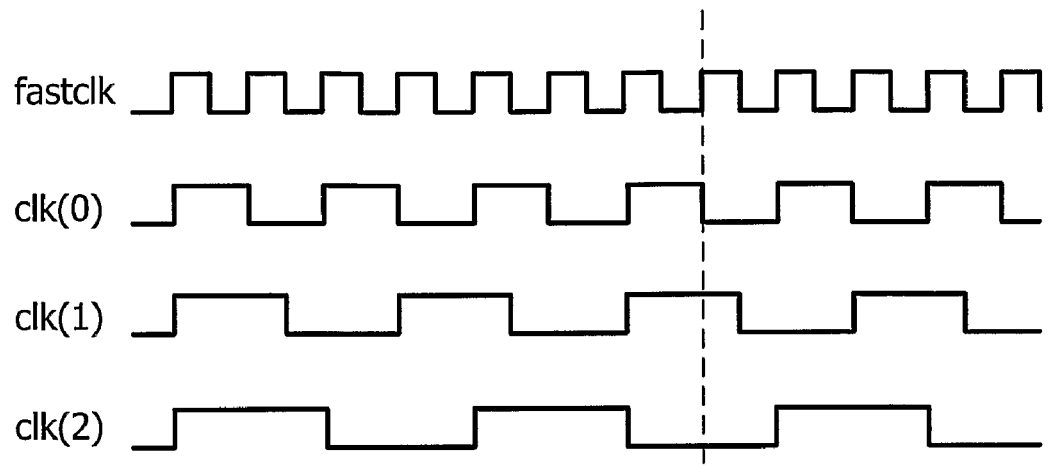
FIGS. 1A and 1B are timing diagrams illustrating the nature of the clock pulse signals required in accordance with the device and method of the present invention.
Figure 1B:
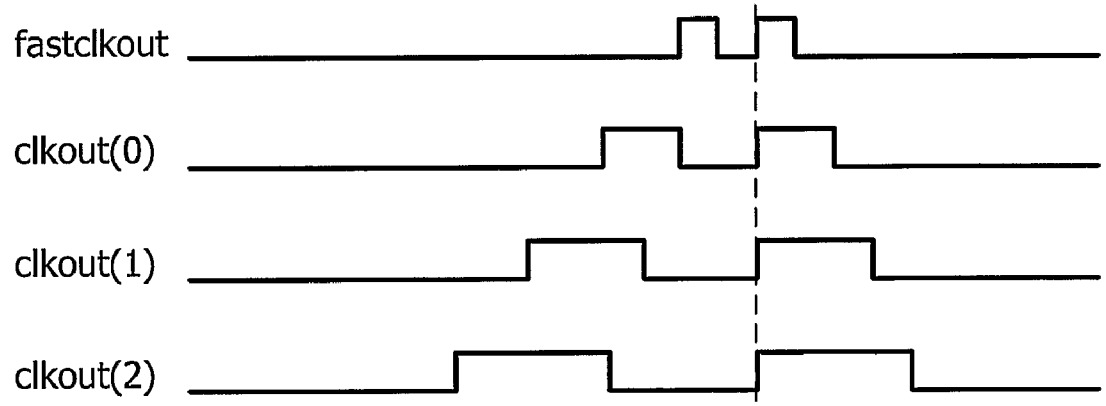
Figure 1B:

Turning first to FIGS. 1A and 1B, there is illustrated there three clock signals clk (0), clk (1), clk (2) in addition to a "fastclk" signal having a frequency F MHz and which represents the fastest clock signal arising within the circuit under test. FIG. 1A illustrates such input clock signals, whereas FIG. 1B illustrates the delay fault test signals produced on each of the four clock signals and identified respectively as fastclkout, clkout (0), clkout (1) and clkout (2) and which illustrate the alignment of the second pulses in each of the two-pulse trains.

While such output signals are known to arise in the aforementioned prior-art document, the particular disadvantages previously discussed arise with regard to their generation, and can be overcome in accordance with the present invention by reference to a control counter producing count values counter_p as illustrated for example in FIG. 1B.

For confirmation, it should be appreciated that clk (0) has a frequency of F/2, clk (1) has a frequency of F/3 and clk (2) has a frequency F/4.

Figure 2:
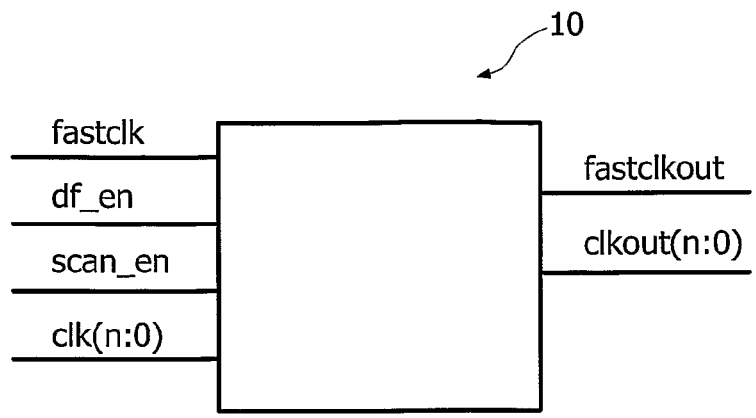
FIG. 2 is a schematic diagram of a delay fault pulse generator embodying the present invention and illustrating the pinout of such a generator.

Turning now to FIG. 2 there is illustrated the pinout of a delay fault past generator 10 embodying the present invention.

The delay fault pulse generator block is introduced between the clock generator, which generates the application frequency clocks and the digital block arranged to receive the clocks from the clock generator. The pulse generator 10 is arranged to produce the two application frequency pulses on each clock passing through it, with their second rising edges aligned when required. Otherwise, the generator simply passes the clocks unaltered.

Referring again to FIG. 2, "fastclk" is the fastest clock with frequency F and all other clocks, clk(i) have a frequency fclk(i) such that $F/fclk(i)$=whole number for all $i$.

The following truth table Table 1 gives the function of the delay fault block:

TABLE 1

| Df-en | Scan_en | clkout |
|-------|---------|--------|
| 0 | 0 | clk |
| 0 | 1 | clk |
| 1 | 0 | pulses |
| 1 | 1 | clk |

Further requirements and advantages are that the clock outputs have 0 ps skew, minimum delays should be exhibited to output the pulses, after a request has been made. Also delays in the clock signals when the generator is not in an enabled mode should be a minimum.

An example in which there are three clocks, clk (0), clk(1), clk (2) in addition to "fastclk" which has a frequency of F MHz is such that:

Clk(0) has a frequency of F/2;

Clk(1) has a frequency of F/3; and

Clk(2) has a frequency of F/4.

The input clocks are those as shown in FIG. 1A and the output clocks are those as shown in the FIG. 1B. The output clocks FIG. 1B have their second rising edge aligned and it can be seen that on each output clock there are two at respective application frequencies.

Figure 5:
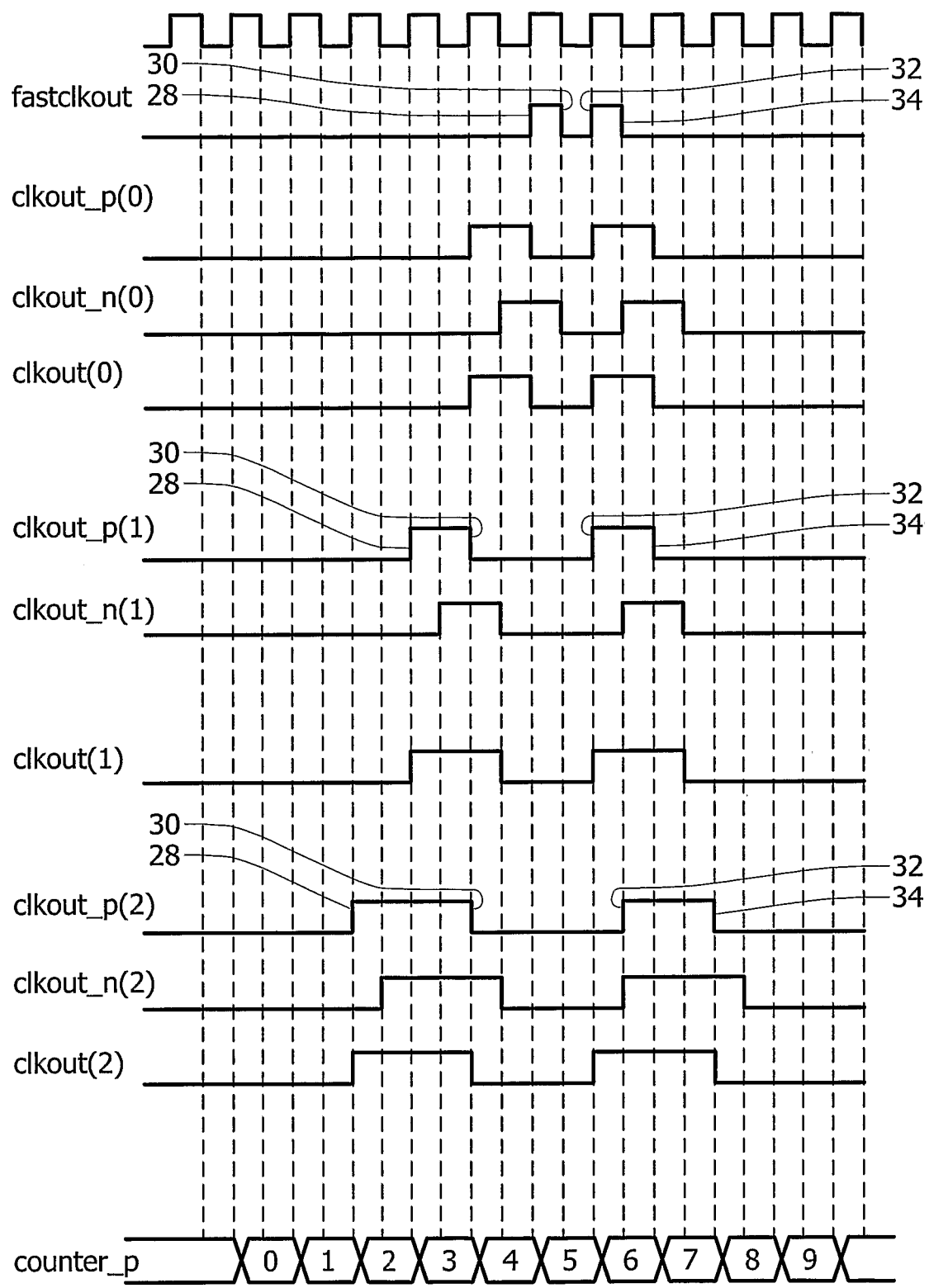
FIG. 5 is a timing diagram serving to illustrate the generation of the two-pulse test signals arising in accordance with the present invention and with the rising edges of the respective second pulses aligned.

The concept embodied by the present invention is illustrated in particular with reference to FIG. 5 and is artificially to generate the two clock pulses corresponding to each input clocks. On this basis, the input and the output clocks have no phase relationship. Since just two pulses are required at each clock, the output clocks, clkout(i), can be produced by reference to a reference counter, "counter_p", which starts counting after reset. Each output clock, clkout(i) is switched ON (put to "1") when "counter_p" is greater than certain reference count called fecount (i) 28, and remains ON while the count value, "counter_p" is less than or equal to a certain reference count secount (i) 30, and goes off when "counter_p" exceeds this value, to give a single pulse.

The second pulse starts for each clock when "counter_p" reaches a common reference count value 32, since the second rising edges are to be aligned. Each clkout(i) is switched ON after this common count value 32 called "max" and then remains ON until "counter_p" is less than or equal to a certain reference count postcount(i) 34, and goes off, after the count at "counter_p" has exceeded this value.

The fecount(i) 28, secount(i) 30, and postcount(i) 34 values are all variables, and are functions of their respective divratios (i), wherein divratio(i)=F/f(i), where F=frequency of the "fastclk" and f(i) is the frequency of the clock in question, and a value "max" which is constant and is equal to the maximum divratio (i), also referred to here as "divratio_max"

The count values 28,30 are derived as follows:

$f$ecount($i$)28=max-$div$ratio $s$ecount($i$)30=max-$div$ratio ($i$)/2; if $div$ratio($i$) is an even number $s$ecount($i$)30=max-($div$ratio($i$)/2+1); if $div$ratio($i$) is an odd number, where $div$ratio($i$)/2 is rounded to the nearest smaller integer.

Based on the above calculations, the pulse train "clkout_p (i)" is provided as shown in FIG. 5. As long as "divratio(i)" is an even number, "clkout_p(i)" is the final output. However where "divratio(i)" is an odd number, "clkout_p" does not have 50% duty cycle. In this case, the final output is supposed to be clkout_p(i) OR clkout_n(i) as also shown in FIG. 5, where "clkout_n(i) is the delayed version of "clkout_p(i)" and produced by inverted "fastclk" (which is also called "fastclk_n")

The count value 34 is derived as follows:

Postcount(i)34=max+divratio(i)/2 and if divratio is an odd number, then divratio(i)/2 is rounded to the nearest smaller integer Considering an example with the following values:
divatio(0)=2,
divraio(1)=3,
divraio(3)=4
then the following count values arise for each clock signal:
divratio_max=4 (which as noted above is also referred to as "max")
fecount(0)=2, secount (0)=3, postcout (0)=5
fecount (1)=1, secount (1)=2, postcout (1)=5
fecount (2)=0, secount (2)=4, postcout (2)=6

As will be appreciated the ratios of the frequency of "fastclk" (ffclk) and the frequencies of the input clocks (fclk(i)), are calculated by their respective counters [divratio(i)], such that divratio(i)=ffclk/fclk(i) and then the maximum ratio is evaluated as "divratio_max". The counter values at which the clock pulse values are initiated are therefore created as noted.

Figure 3:
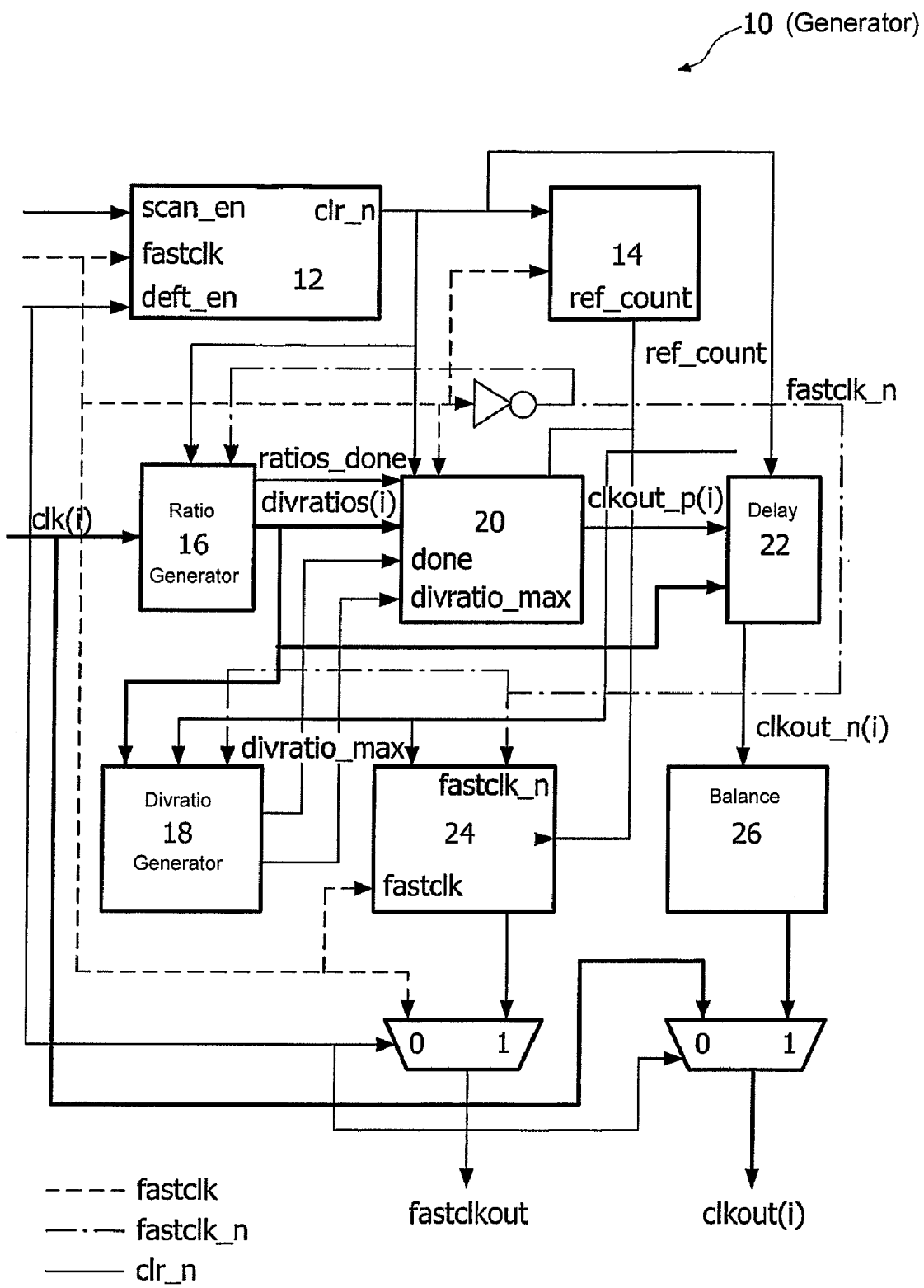
FIG. 3 is a schematic block diagram of the generator of FIG. 2.

Turning now to FIG. 3 there is provided a block diagram of an embodiment of the delay fault pulse generator of FIG. 2.

The generator 10 comprise a reset logic block 12 which is arranged to detect a "1" to "0" transition on its "scan_en" input and if the "deft_en" (delay fault enable) signal is "1", then the generator produces a one-clock "0" pulse called "clr_n". The entire circuit resets and all the registers in the design are cleared to "0".

A counter 14 is included that counts at the rising edge of the "fastclk" signal. This is the reference counter, which provides a reference point as to where the individual clocks are to be switched ON or OFF so as to produce the required pulse signals.

A ratio generator 16 receives the clk(i) signal and is arranged to evaluate the "divratios(i)"=ffclk/fclk(1). Each divratio (i) is implemented as a counter which counts between the two rising edges of its respective clk(i), on the "fastclk_n" (inverted fastclk) signal. The counter stops thereafter and stores the final count as divratio(i).

Advantageously, two counters are used to calculate each divratio (i) value, which as mentioned comprises the ratio of the frequency of the fastclk to the frequency of the clk(i).

Further, one counter is fed by "fastclk_n" and is arranged to count when its enable input is "1". This enable signal is generated by the other of the two counters which comprises a two bit counter identified as "encabl_generator" and which counts as 00,01,10 before it stops. This counter is fed by the clk(i) signal, whose division ratio is to be calculated. The LSB of this two bit counter is fed to the divraio(i) counter, on its "enable" pin so that the counter, divratio(i) counts the number of "fastclks" between two rising edges of clk(i). The MSB of the "enable_generator" counter is arranged to represent a "done(i)" signal indicating thereby that the ratio is ready.

Figure 4:
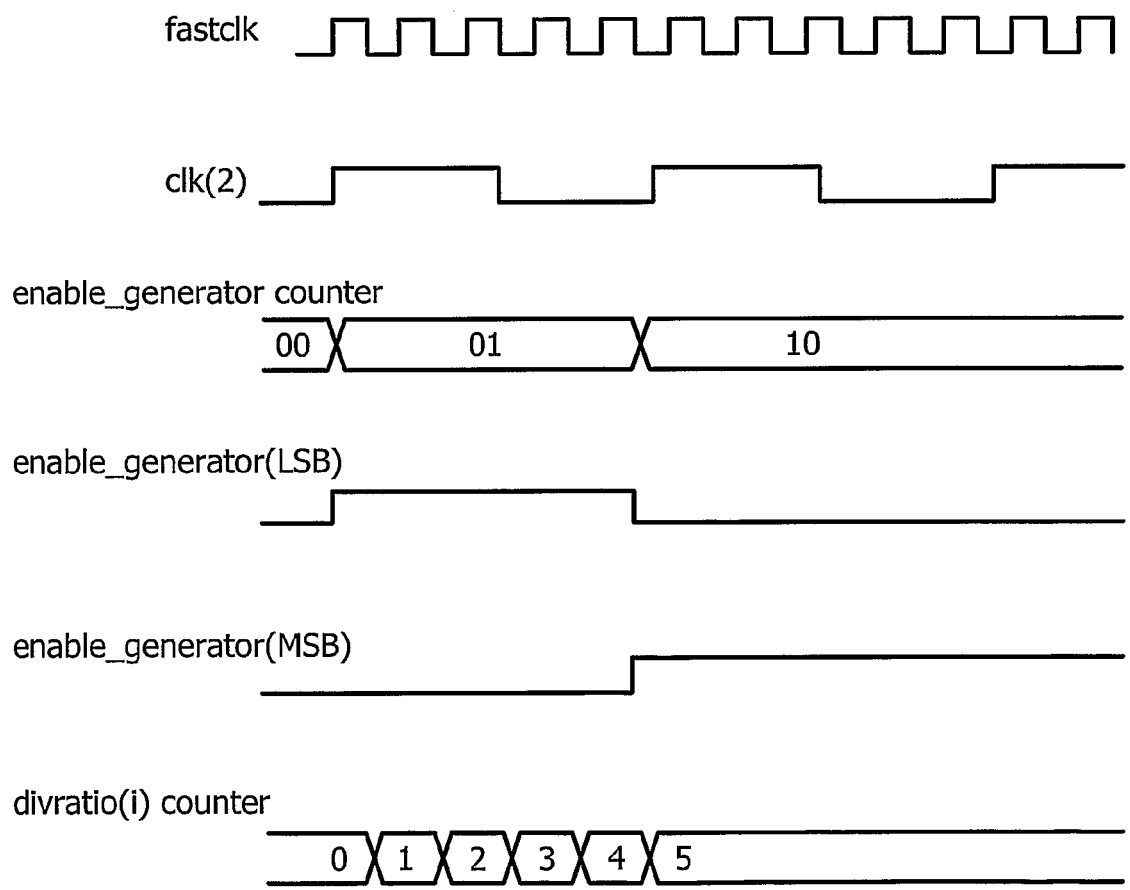
FIG. 4 is a timing diagram illustrative of the operation of the ratio generator block illustrated in FIG. 3.

FIG. 4 provides an illustration of the working of this block, in this example, clk(i) has a division ratio of five. As can be seen when the "done" signal goes high to a logic "1" the divratio (i) counter has the ratio stored therein.

When each of the "done(i)" goes high "1", a "ratios_done" signal is generated which is the logical AND of all the "done (i)" signals.

The divratios(i) signals from the ratio generator 16 are delivered to a maximum divratio generator block 18, a clock control 20 and a delay 22.

The block 18 evaluates the "divratio_max" or simply "max". It is arranged to receive all of the divratios(i) and to output "divratio_max" which is the greatest among the divraio(i) values. This blocks operates on the "fastclk_n" signal.

The clock control 20 produces the "clkout_p" depending upon the divratios(i), and the "max" values and is arranged to operate on the "fastclk" signal.

The delay 22 is arranged to delay each clk(i) by half of the fastclk clock cycle. It operates on "fastclk_n" and serves to adjust the duty cycle of the clocks with odd divratio(1) values.

A test clock pulse generator block 24 is included and is responsible for producing two pulses on the "fastclk" signal. Since this is the fastest clock signal, the counter 14 is clocked on this clock. However it is not possible to simply generate two pulses of "fastclk" by "counter_p". On this basis, specific measures are taken to generate the required pulses. An "enable" signal is generated at "counter_p"="max"−2 and "counter_p"="max"+1 which define a window that is wide enough to contain two "fastclk" pulses. This "enable" output is then delayed by half a clock cycle by clocking it through "fastclk_n", and so "fastclk_out" is then equal to result of "enable" AND "fastclk".

The delay 22 feeds to a skew balance block 26 which is arranged to balance the skew between the edges of the clocks so produced. Since the ODD clocks have an extra OR gate in their path, similar delays must be added to the clocks with even ratios. Also the "fastclk" needs to be balanced against the remaining clocks.

The operation of the circuit arrangement embodying the present invention and as illustrated in FIG. 3 is now described.

Any 1 to 0 transition in the scan_en signal serves to trigger the pulse generator and at this point in time if deft_en is "1", then, the fault pulse generator is effectively enabled to produce the required two pulse trains.

The ratios of the frequency of the "fastclk" to the frequencies of each individual clock input clk(i) are calculated with their respective counters, divraio(i), and this information is passed to the block 16 to evaluate the maximum ratio, "divratio_max" or simply "max". The counter_p within the block 14 then starts counting, and at certain point in time, i.e. fecount, secount, max and postcount, as described above the respective clock switching is done to produce "clkout_p" which is delayed by half a fastclk cycle by the falling edge of fastclk to produce "clkout_n". The "clkout_n" value is then ORed with clkout_p for the clocks with odd divratio(i) values to produce the final clkout(i). However, for even values of "divratio(i)", the "clkout_p" becomes the final output.

The fastclkout is produced from the result of "enable" AND "fastclk". The "enable" value is produced as described above.

If, however, deft_en is "0", then clkout(1) will be less than or equal to clk(i), and so, without the present invention enabled, the input clocks are passed directly through as the output clocks.

The illustrated embodiment exhibits the following advantageous features of the invention.

Since the arrangement artificially generates the clocks, it need not wait for a point in time where all input clocks are rising together, and then output those pulses. The invention can therefore operate very quickly and the clock outputs are produced in minimum time, after the request has been made.

The time required to produce the pulses is given by, $$2*n(divratios\_evaluation)+n(max\_calculation)+max+1$$

where:
- 2*ndivratios_evaluation=time to evaluate the divratio(i)= ffastclk/fslowestclk;
- nmax_calculation=number of clocks to calculate the maximum value, which may take up to the number of clocks in design (excluding fastclk) if sequential method is used to calculate the max value; and
- Max=ffastclk/fslowestclk Therefore if there are, for example, five clocks in the design with
- divratio(0)=2
- divratio(1)=3
- divratio(2)=5
- divratio(3)=6
- divratio(4)=7, then the typical waiting time would be $$2*7+5+7+1=27 \text{ clocks}$$

With the prior-art arrangements in which it is necessary to wait for all the clocks to rise together, it will be necessary to wait LCM number of clocks, where LCM is the Least Common Multiple of all the divratio(i) which in the above case is LCM(2,3,5,6,7)=210. This occurs since the number of fastclk periods between the two instances where all clocks rise together is the LCM of all the divratio(i).

The invention therefore comprises a fast but extremely small circuit arrangement, requiring very few components.

Further, the circuit arrangement is advantageously generic in that its VHDL design is parameterised and just by changing a minimal number of parameters, new designs can be produced ready for any required number of clocks having different frequency division ratios.

Since there is just a multiplexer in the datapath at application mode, the clocks are not delayed significantly and so this offers a reduced delay when in application mode.

It should be appreciated however that, from the illustrated example, all the input clocks clk(i) except fastclk, should have frequencies fclk(i) such that, F/fclk(i)=whole number of all i, and where F is the frequency of the fastclk.

The invention claimed is:

1. Delay fault test circuitry for producing a train of two clock pulses in response to two respective clock signals of different frequency associated with logic circuits arranged to run at different speeds, and arranged to align the rising edges of the second clock pulses of the clock signals, the circuitry including:
    counting means for producing a reference count value;
    means for initiating the first of the two clock pulses when the said count value reaches a first threshold value;
    means for ending the first of the two clock pulses when the said count value reaches a second threshold value;
    means for initiating the second of the two clock pulses when the said count value reaches a third threshold value;
    means for ending the second of the two clock pulses when the count value reaches a fourth threshold value; wherein
    the third threshold value is common for both clock signals and the first, second and fourth threshold values are based on the, respective frequencies of the clock signals.

2. Delay fault test circuitry as claimed in claim 1, wherein the said first, second and fourth threshold values comprise functions of the ratio of the fastest clock frequency to the clock frequency associated with the logic circuitry under test.

3. Delay fault test circuitry as darned in claim 2, wherein the first, second and fourth threshold values are functions of the maximum of the aforesaid ratios.

4. Delay fault test circuitry as claimed in claim 3, wherein the first threshold value is derived from the difference between the said maximum ratio value and the ratio value for the clock signal associated with the logic circuit under test.

5. Delay fault test circuitry as claimed in claim 4, wherein the fourth threshold count value is determined on the basis of the sum of the maximum ratio and half of the particular division ratio of the clock signal associated with the logic circuit under test.

6. Delay fault test circuitry as claimed in claim 4, and including a ratio generator in which the aforementioned ratio is implemented by way of a counter.

7. Delay fault test circuitry as claimed in claim 6 and employing two counters in order to calculate each of the aforesaid ratios.

8. Delay fault test circuitry as claimed in claim 7, wherein the first of the two counters is arranged to be fed by the fastclk signal and arranged to receive an enable signal generated by the other of the two said counters.

9. Delay fault test circuitry as claimed in claim 8, wherein the second counter is arranged to be fed by the clock signal with respect to which the division ratio is to be calculated.

10. Delay fault test circuitry as claimed in claim 9, wherein the least significant bit of the said second counter comprises the enable signal delivered to the said first counter, and wherein the most significant bit of the second counter comprises a signal indicating that the required ratio has been determined.

11. Delay fault test circuitry as claimed in claim 3, wherein the second threshold value is determined on the basis of the difference between the said maximum ratio value and half of the ratio value for the clock signal associated with the logic circuit under test, if the said ratio value comprises an even number.

12. Delay fault test circuitry as claimed in claim 3, wherein the second threshold value is determined on the basis of the difference between the maximum ratio value and half of the ratio value for the clock signal associated with the logic circuit under test, plus one, if the particular ratio comprises an odd number.

13. Delay fault test circuitry as claimed in claim 3, and including a fastclk pulse generator in which an enable signal is generated within a window defined by reference to the said maximum ratio.

14. A method of producing a delay fault test signal comprising a train of two clock pulses in response to two respective clock signals of different frequency associated with logic circuits arranged to run at different speeds, and wherein the rising edges of the second of the clock pulses are aligned, the method including the steps of:
    producing the reference count value;
    initiating a first of the two clock pulses when the said count value reaches a first threshold value;
    ending the first of the two clock pulses when the said count value reaches a second threshold value;
    initiating the second of the two clock pulses when the said count value reaches a third threshold value;
    ending the second of the two clock pulses when the count value reaches a fourth threshold value; wherein
    the third threshold value is common for both clock signals and the first, second and fourth threshold values are based on the respective frequencies of the clock signals.

15. A method of producing a delay fault test signal including a train of two clock pulses in response to two respective clock signals of different frequency associated with logic circuits arranged to run at different speeds, where the rising edges of the second clock pulses are aligned, the circuitry including:
- counting means for producing a reference count value;
- means for initiating the first of the two clock pulses when the said count value reaches a first threshold value;
- means for ending the first of the two clock pulses when the said count value reaches a second threshold value;
- means for initiating the second of the two clock pulses when the said count value reaches a third threshold value;
- means for ending the second of the two clock pulses when the count value reaches a fourth threshold value; wherein
- the third threshold value is common for both input clock signals and the first, second and fourth threshold values are based on the, respective frequencies of the clock signals; and wherein
- the said first, second and fourth threshold values comprise functions of the ratio of the fastest clock frequency to the clock frequency associated with the logic circuitry under test.

16. A delay fault test circuit to concurrently provide output clock signals respectively in response to input clock signals of different frequency respectively associated with logic circuits arranged to run at different speeds, the circuit including:
- a counter to produce a reference count value; and
- a clock pulse generator to produce concurrent output clock signals by, for each output clock signal generated from an input clock signal,
- initiating the first of two clock pulses when the reference count value for the output clock signal reaches a first threshold value that is based upon the frequency of the input clock signal;
- ending the first of the two clock pulses when the reference count value reaches a second threshold value that is based upon the frequency of the input clock signal;
- initiating the second of two clock pulses when the reference count value reaches a third threshold value that is common for the input clock signals; and
- ending the second of the two clock pulses when the reference count value reaches a fourth threshold value that is based upon the frequency of the input clock signal.

* * * * *